(12) United States Patent
Lee et al.

(10) Patent No.: US 11,009,524 B2
(45) Date of Patent: May 18, 2021

(54) HIGH SPEED PROBE CARD DEVICE AND RECTANGULAR PROBE

(71) Applicant: CHUNGHWA PRECISION TEST TECH. CO., LTD., Taoyuan (TW)

(72) Inventors: Wen-Tsung Lee, New Taipei (TW); Kai-Chieh Hsieh, Taoyuan (TW)

(73) Assignee: CHUNGHWA PRECISION TEST TECH. CO., LTD., Taoyuan (TW)

(*) Notice: Subject to any disclaimer, the term of this patent is extended or adjusted under 35 U.S.C. 154(b) by 0 days.

(21) Appl. No.: 16/732,350

(22) Filed: Jan. 2, 2020

(65) Prior Publication Data

US 2020/0233014 A1    Jul. 23, 2020

(30) Foreign Application Priority Data

Jan. 23, 2019   (TW) .................................. 108102479

(51) Int. Cl.
*G01R 1/067* (2006.01)
*G01R 31/28* (2006.01)
*G01R 1/073* (2006.01)

(52) U.S. Cl.
CPC ..... *G01R 1/06733* (2013.01); *G01R 1/06716* (2013.01); *G01R 1/07342* (2013.01); *G01R 31/2831* (2013.01)

(58) Field of Classification Search
CPC ............ G01R 1/06733; G01R 1/06716; G01R 1/07342; G01R 31/2831
See application file for complete search history.

(56) References Cited

U.S. PATENT DOCUMENTS

| 4,773,877 | A  | * | 9/1988  | Kruger ............... | G01R 1/06722 324/755.05 |
| 6,767,219 | B2 | * | 7/2004  | Maruyama .......... | G01R 1/0675 324/756.02 |
| 2004/0121627 | A1 | * | 6/2004 | Grube ................ | G01R 1/06733 439/66 |
| 2009/0315578 | A1 | * | 12/2009 | Lou .................... | G01R 1/06733 324/762.02 |

* cited by examiner

*Primary Examiner* — Paresh Patel
(74) *Attorney, Agent, or Firm* — Li & Cai Intellectual Property Office (57) ABSTRACT

A rectangular probe includes two broad side surfaces and two narrow side surfaces each parallel to a longitudinal direction of the rectangular probe. The rectangular probe includes a middle segment, a first connecting segment and a second connecting segment respectively extending from two opposite ends of the middle segment, a first contacting segment and a second contacting segment respectively extending from the first and second connecting segments, and a stroke structure arranged on the middle segment, the first contacting segment, or the second contacting segment. A longitudinal thru-hole of the stroke structure is formed by penetrating through the two broad side surfaces. Two transverse grooves of the stroke structure are respectively recessed in the two broad side surfaces. The two transverse grooves are configured to move in two directions away from each other so as to reduce a length of the rectangular probe.

10 Claims, 10 Drawing Sheets

HIGH SPEED PROBE CARD DEVICE AND RECTANGULAR PROBE

CROSS-REFERENCE TO RELATED PATENT APPLICATION

This application claims the benefit of priority to Taiwan Patent Application No. 108102479, filed on Jan. 23, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe card, and more particularly to a high speed probe card device and a rectangular probe.

BACKGROUND OF THE DISCLOSURE

When a semiconductor chip is tested, a testing apparatus is electrically connected to the semiconductor chip (i.e., device under test, DUT) by a probe card device, so that a testing result can be obtained from the signal transmission between the semiconductor chip and the probe card device. A conventional probe card device includes a plurality of probes corresponding in position to the electrical pads of the DUT, and the probes can be in contact with the electrical pads of the DUT.

However, when the conventional probe card device is applied to a signal transmission test of high speed signals, the probes have to be deformed for generating an elastic force before the signal transmission test, so that the probe of the conventional probe card device is longer and not suited to transmit a high speed signal.

SUMMARY OF THE DISCLOSURE

In response to the above-referenced technical inadequacies, the present disclosure provides a high speed probe card device and a rectangular probe to effectively improve the issues associated with conventional probe card devices.

In one aspect, the present disclosure provides a high speed probe card device, which includes an upper die, a lower die, and a plurality of rectangular probes. The upper die has a plurality of upper openings. The lower die has a plurality of lower openings and is parallel to the upper die. The lower openings respectively correspond in position to the upper openings. The rectangular probes respectively pass through the upper openings of the upper die and respectively pass through the lower openings of the lower die. Each of the rectangular probes is in an elongated shape defining a longitudinal direction. An outer surface of each of the rectangular probes includes two broad side surfaces parallel to the longitudinal direction and two narrow side surfaces parallel to the longitudinal direction. Each of the rectangular probes includes a middle segment, a first connecting segment, a second connecting segment, a first contacting segment, a second contacting segment, and at least one stroke structure. The middle segment is arranged between the upper die and the lower die. The first connecting segment extends from one end of the middle segment and is arranged in the corresponding upper opening. The second connecting segment extends from the other end of the middle segment and is arranged in the corresponding lower opening. The first contacting segment extends from the first connecting segment and is arranged outside of the corresponding upper opening. The second contacting segment extends from the second connecting segment and is arranged outside of the corresponding lower opening. The at least one stroke structure is arranged on at least one of the middle segment, the first contacting segment, and the second contacting segment. The at least one stroke structure includes a longitudinal thru-hole and two transverse grooves. The longitudinal thru-hole is formed by penetrating through the two broad side surfaces and is parallel to the longitudinal direction. The two transverse grooves are respectively recessed in the two broad side surfaces and are respectively arranged at two opposite sides of the longitudinal thru-hole. The two transverse grooves extend from the longitudinal thru-hole to the two narrow side surfaces, respectively, and the two transverse grooves are located on a plane perpendicular to the longitudinal direction. When the rectangular probes of the high speed probe card device abut against a device under test (DUT), the two transverse grooves of the at least one stroke structure of each of the rectangular probes respectively move in two directions away from each other, a portion of each of the rectangular probes formed with the at least one stroke structure has a length in the longitudinal direction that decreases, and the portion of each of the rectangular probes generates an elastic force.

In one aspect, the present disclosure provides a rectangular probe having an elongated shape defining a longitudinal direction and having an outer surface that includes two broad side surfaces parallel to the longitudinal direction and two narrow side surfaces parallel to the longitudinal direction. The rectangular probe includes a middle segment, a first connecting segment and a second connecting segment both respectively extending from two opposite ends of the middle segment, a first contacting segment extending from the first connecting segment in a direction away from the middle segment, a second contacting segment extending from the second connecting segment in a direction away from the middle segment, and at least one stroke structure arranged on at least one of the middle segment, the first contacting segment, and the second contacting segment. The at least one stroke structure includes a longitudinal thru-hole and two transverse grooves. The longitudinal thru-hole is formed by penetrating through the two broad side surfaces and is parallel to the longitudinal direction. The two transverse grooves are respectively recessed in the two broad side surfaces and are respectively arranged at two opposite sides of the longitudinal thru-hole. The two transverse grooves extend from the longitudinal thru-hole to the two narrow side surfaces, respectively, and the two transverse grooves are located on a plane perpendicular to the longitudinal direction. When the rectangular probe abuts against a device under test (DUT), the two transverse grooves of the at least one stroke structure respectively move in two directions away from each other, a portion of the rectangular probes formed with the at least one stroke structure has a length in the longitudinal direction that decreases, and the portion of the rectangular probes generates an elastic force.

Therefore, in the high speed probe card device of the present disclosure, the rectangular probe can generate an elastic force by the stroke structure, so that the rectangular probe does not need to have a curved elastic portion before being abutted against the DUT. Accordingly, the length of the rectangular probe of the present disclosure is evidently less than that of the conventional probe, so that the high speed probe card device (or the rectangular probe) of the present disclosure is suitable to be applied to a transmission test with high speed signals.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 6, a first embodiment of the present disclosure provides a high speed probe card device 1000. The high speed probe card device 1000 includes a probe head 100 and a space transformer 200 connected to one side of the probe head 100 (e.g., a top side of the probe head 100 shown in FIG. 1), and the other side of the probe head 100 (e.g., a bottom side of the probe head 100 shown in FIG. 1) is configured to abut against and test a device under test (DUT), such as a semiconductor wafer (not shown).

It should be noted that only a part of the high speed probe card device 1000 is shown in the drawings of the present embodiment for presenting the structure and connection relationship of each component of the high speed probe card device 1000, but the present disclosure is not limited to the drawings. The following description describes the structure and connection relationship of each component of the high speed probe card device 1000.

Figure 1:
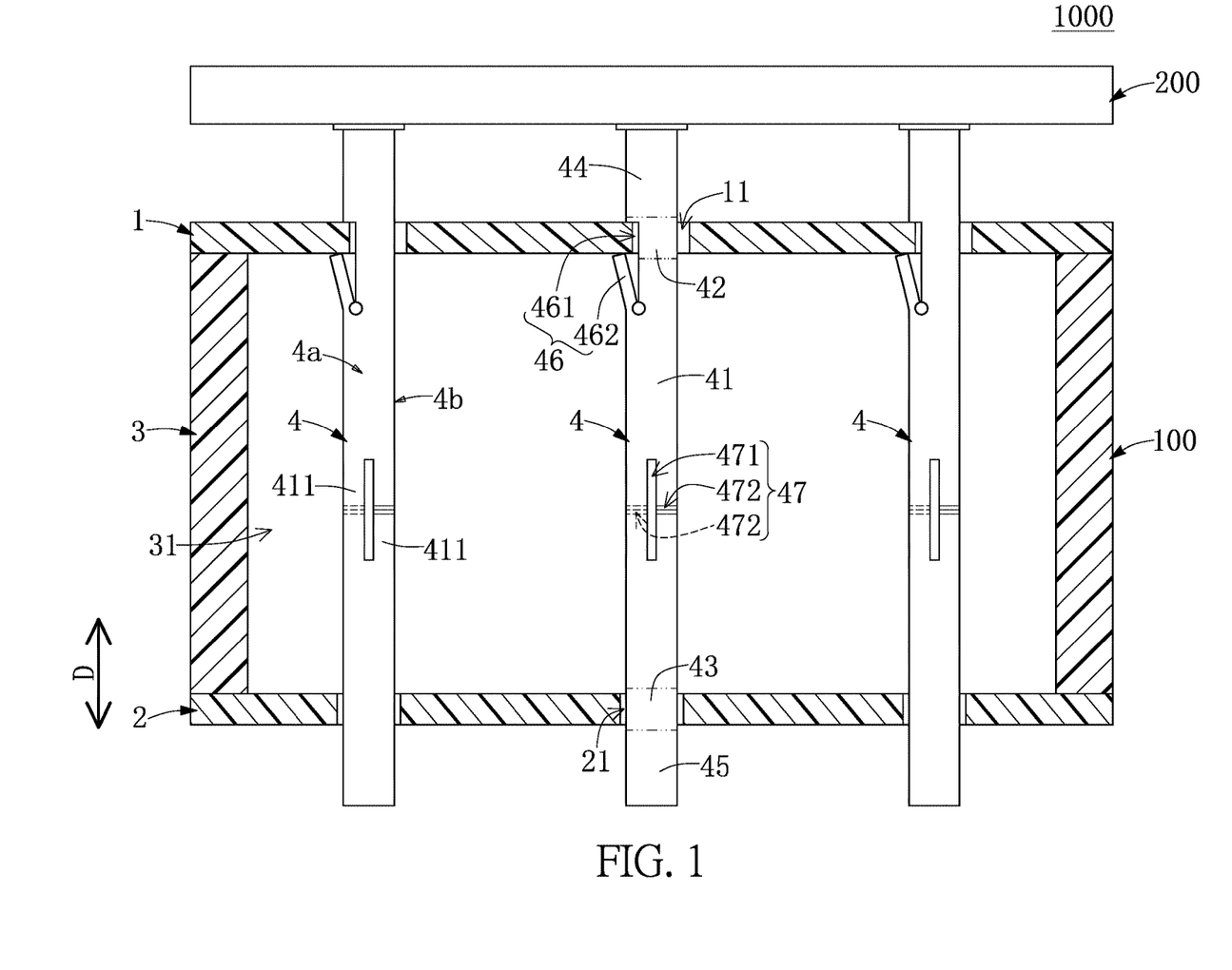
FIG. 1 is a cross-sectional view of a high speed probe card device according to a first embodiment of the present disclosure.

As shown in FIG. 1, the probe head 100 includes an upper die 1, a lower die 2, a spacer 3 sandwiched between the upper die 1 and the lower die 2, and a plurality of rectangular probes 4. However, in other embodiments of the present disclosure, the spacer 3 of the probe head 100 can be omitted or replaced by other components. Moreover, the rectangular probe 4 can be independently used (e.g., sold) or in cooperation with other components.

Since the spacer 3 is sandwiched between the upper die 1 and the lower die 2, the upper die 1 and the lower die 2 are preferably parallel to each other, but the present disclosure is not limited thereto. The upper die 1 has a plurality of upper openings 11, and the lower die 2 has a plurality of lower openings 21 that respectively correspond in position to the upper openings 11. The spacer 3 in the present embodiment can be an annular structure sandwiched between a periphery portion of the upper die 1 and a periphery portion of the lower die 2. In other words, the spacer 3 has an accommodating space 31 in spatial communication with the upper openings 11 and the lower openings 21. In addition, the present embodiment does not disclose detailed structures of the spacer 3.

Furthermore, the upper die 1 and the lower die 2 in the present embodiment are not staggeredly arranged to each other, and each of the lower openings 21 respectively align with the corresponding upper opening 11 along a longitudinal direction D defined by one of the rectangular probes 4. Each of the rectangular probes 4 is in a straight shape and is retained by at least one of the upper die 1 and the lower die 2. In the present embodiment, the rectangular probes 4 shown in FIG. 1 are positioned at the upper die 1 that is arranged adjacent to the space transformer 200, but the present disclosure is not limited thereto.

Figure 2:
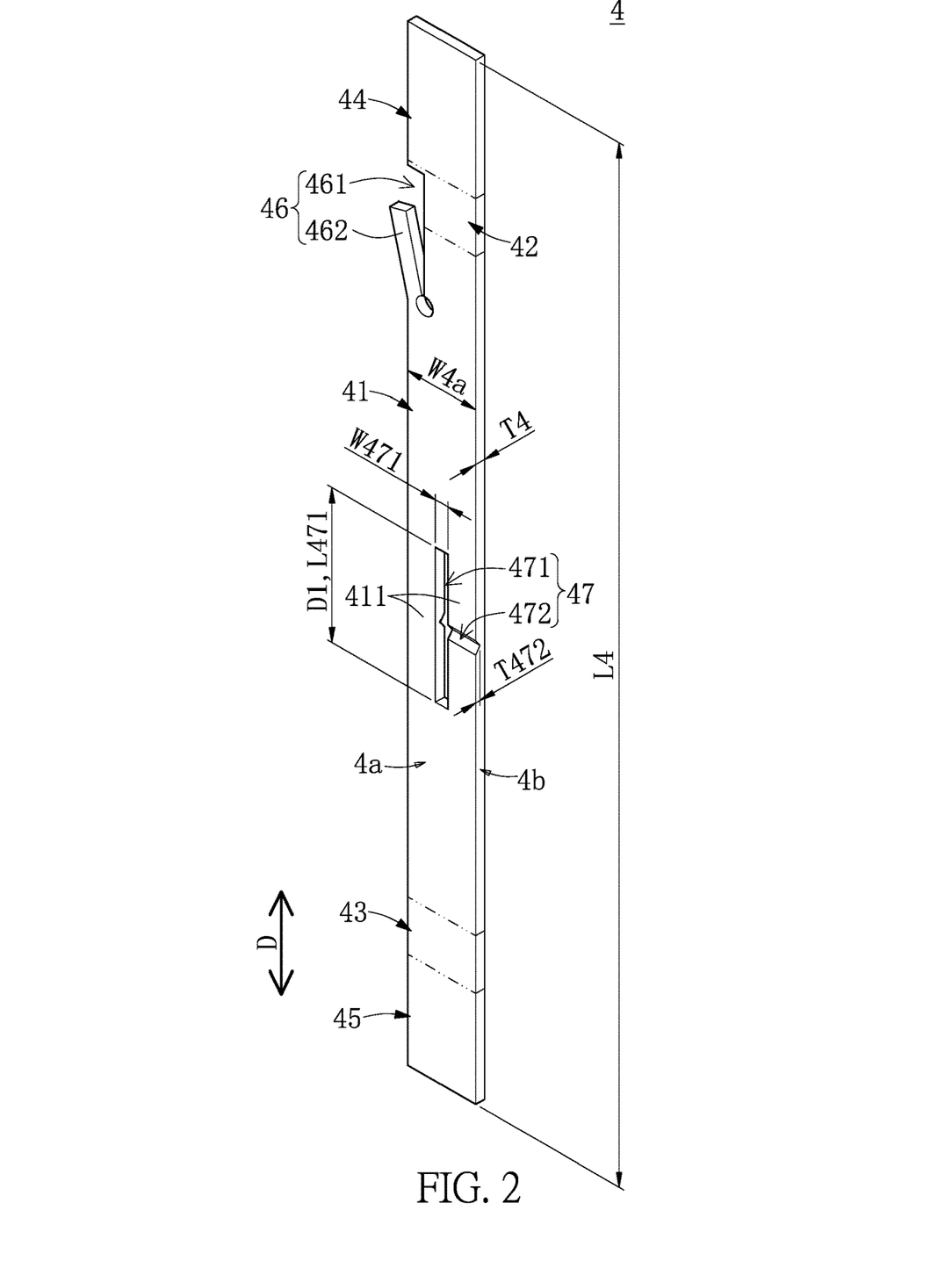
FIG. 2 is a perspective view of a rectangular probe according to the first embodiment of the present disclosure.

As shown in FIG. 1 and FIG. 2, the rectangular probes 4 respectively pass through the upper openings 11 of the upper die 1 and respectively pass through the lower openings 21 of the lower die 2. Each of the rectangular probes 4 is in an elongated shape defining the longitudinal direction D. An outer surface of each of the rectangular probes 4 includes two broad side surfaces 4a parallel to the longitudinal direction D and two narrow side surfaces 4b parallel to the longitudinal direction D. As the rectangular probes 4 of the probe head 100 in the present embodiment are of the same structure, the following description discloses the structure of just one of the rectangular probes 4 for the sake of brevity. However, in other embodiments of the present disclosure, the rectangular probes 4 of the probe head 100 can be of different structures.

The rectangular probe 4 in the present embodiment has a straight structure that is electrically conductive and flexible, and a cross section of the rectangular probe 4 perpendicular to the longitudinal direction D is substantially a rectangle. It should be noted that the high speed probe card device 1000 in the present embodiment is limited to the use of the rectangular probe 4 (the rectangular probe 4 can be made by using MEMS technology), so that the present embodiment excludes any round probe (the round probe is made by a producing process differing from the MEMS technology). In other words, since the production process of the rectangular probe 4 is drastically different from that of any round probe, the round probe does not provide any motivation for the production of the rectangular probe 4.

The rectangular probe 4 includes a middle segment 41, a first connecting segment 42 and a second connecting segment 43 both respectively extending from two opposite ends of the middle segment 41, a first contacting segment 44 extending from the first connecting segment 42 in a direction away from the middle segment 41, and a second contacting segment 45 extending from the second connecting segment 43 in a direction away from the middle segment 41.

In other words, the rectangular probe 4 sequentially includes the first contacting segment 44, the first connecting segment 42, the middle segment 41, the second connecting segment 43, and the second contacting segment 45, which are arranged along a straight direction from the space transformer 200 to the DUT (e.g., a direction from an upper side to a lower side shown in FIG. 1). The first contacting segment 44 is arranged outside of the corresponding upper opening 11 of the upper die 1, and is abutted against a corresponding pad of the space transformer 200. In other words, the space transformer 200 is fixed on the first contacting segments 44 of the rectangular probes 4. The first connecting segment 42 is arranged in the corresponding upper opening 11 of the upper die 1. The middle segment 41 is arranged between the upper die 1 and the lower die 2. That is to say, the middle segment 41 is arranged in the accommodating space 31 of the spacer 3. The second connecting segment 43 is arranged in the corresponding lower opening 21 of the lower die 2. The second contacting segment 45 is arranged outside of the corresponding lower opening 21 of the lower die 2, and is configured to be detachably abutted against a corresponding pad of the DUT (not shown).

Moreover, the rectangular probe 4 includes a retaining structure 46 arranged on the first connecting segment 42 and a part of the middle segment 41 that is arranged adjacent to the first connecting segment 42, and the rectangular probe 4 is fixed in position with the upper die 1 through the retaining structure 46. The retaining structure 46 shown in FIG. 1 and FIG. 2 includes a notch 461 formed in the first connecting segment 42 and an elastic retainer 462 arranged on the part of the middle segment 41 adjacent to the first connecting segment 42. When the rectangular probe 4 is under an assembly process, the retaining structure 46 passes through the corresponding upper opening 11, the notch 461 is engaged with the upper die 1 (i.e., a partial wall defining the upper opening 11 is received in the notch 461), and the elastic retainer 462 is abutted against an inner surface of the upper die 1 so as to position the rectangular probe 4 with the upper die 1, but the present disclosure is not limited thereto.

Figure 3A:
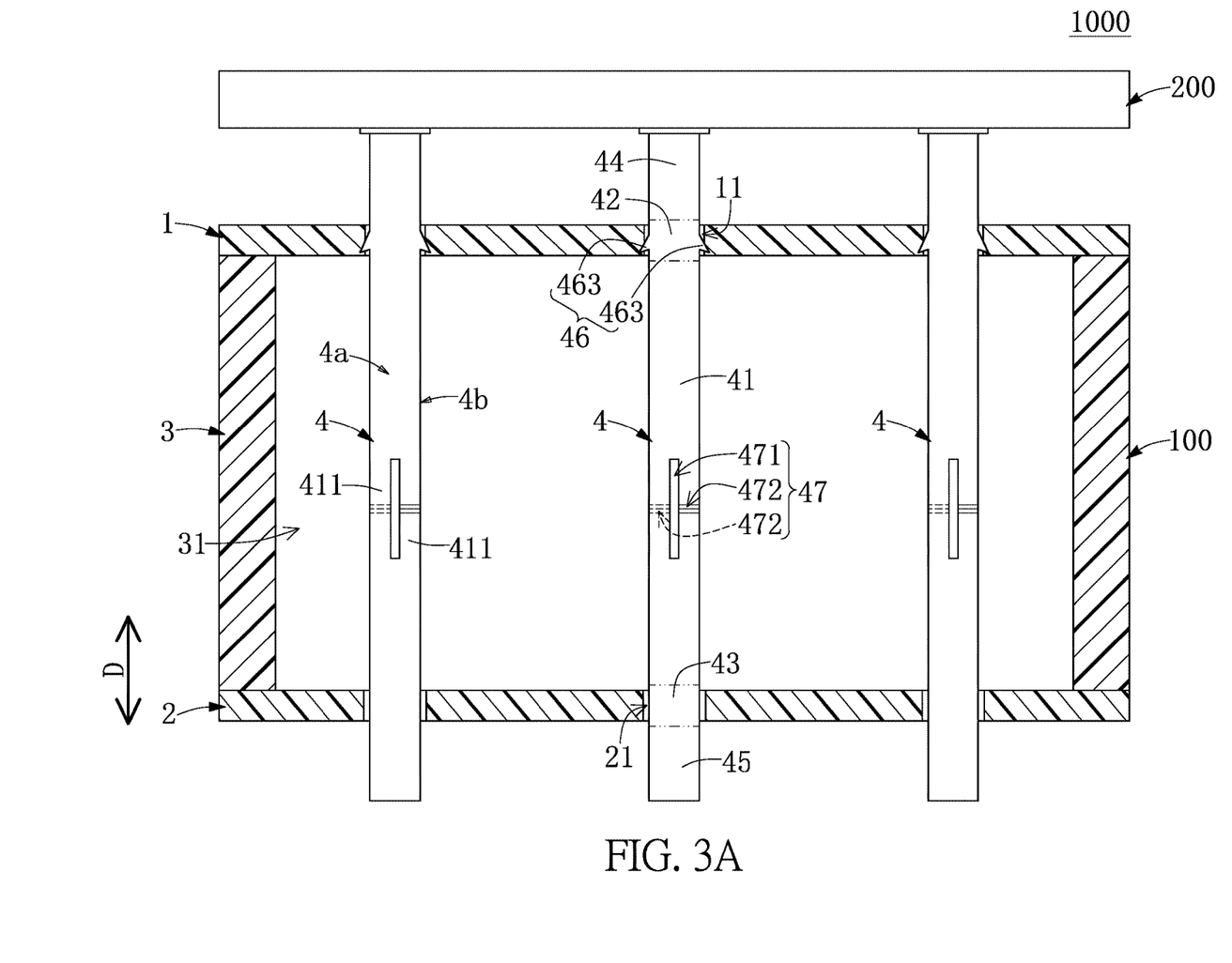
FIG. 3A is a cross-sectional view of the high speed probe card device in another structure according to the first embodiment of the present disclosure.

In addition, as shown in FIG. 3A, the retaining structure 46 can be formed on the first connecting segment 42 of the rectangular probe 4. The retaining structure 46 can include a plurality of protrusions 463 that are interferingly fitted with the corresponding upper opening 11, so that the rectangular probe 4 can be positioned at the upper die 1 through the retaining structure 46. Accordingly, the retaining structure 46 of the rectangular probe 4 in the present disclosure can be arranged on at least one of the first connecting segment 42 and a part of the middle segment 41 that is arranged adjacent to the first connecting segment 42.

Figure 3B:
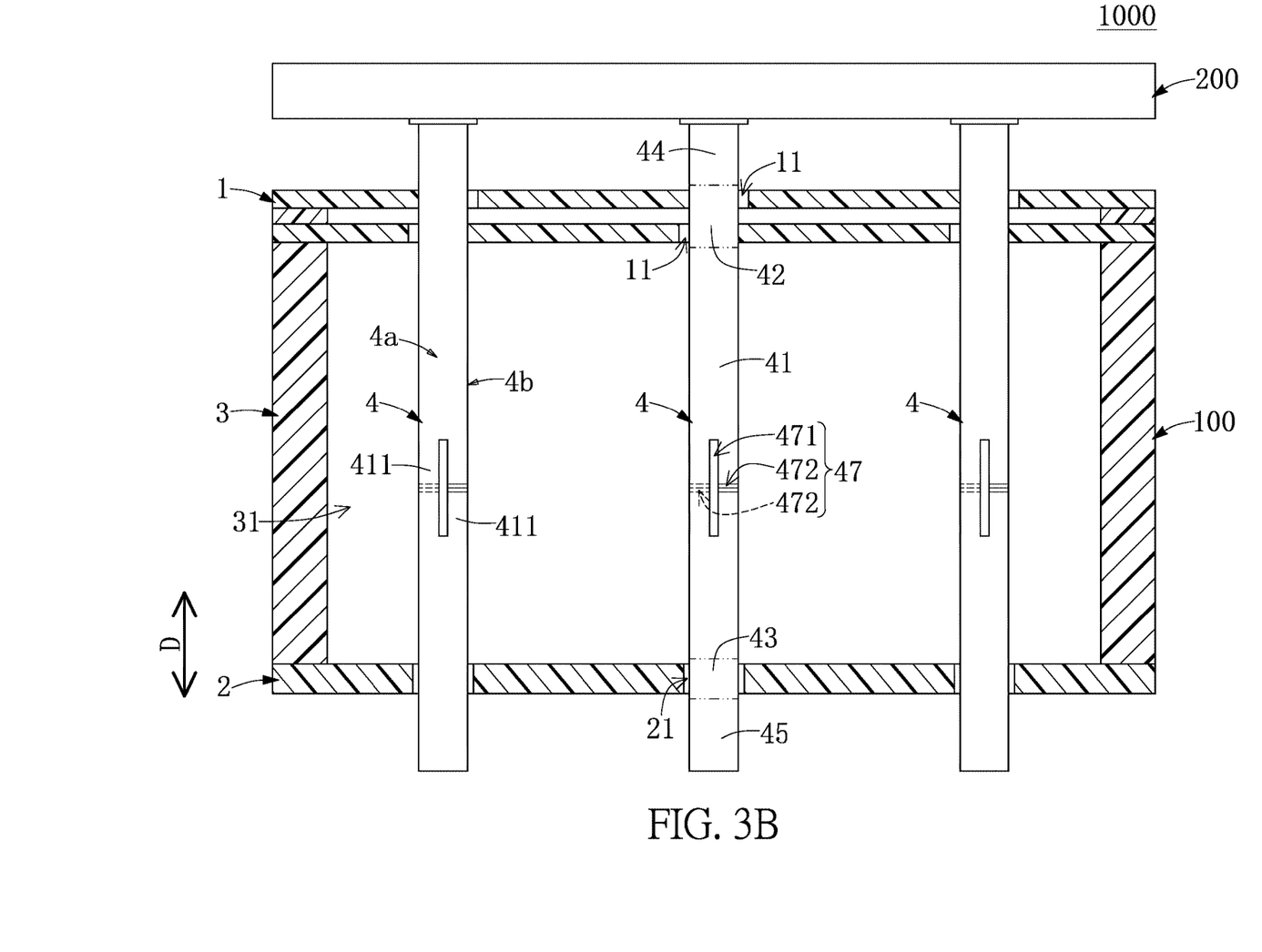
FIG. 3B is a cross-sectional view of the high speed probe card device in still another structure according to the first embodiment of the present disclosure.

Moreover, as shown in FIG. 3B, the upper die 1 can include two sub-dies in a staggered arrangement, and each of the two sub-dies has an upper opening 11 corresponding in position to the first connecting segment 42, so that the first connecting segment 42 of the rectangular probe 4 can be held by the upper openings 11 of the two sub-dies for positioning the rectangular probe 4 with the upper die 1.

In the present embodiment, the first contacting segment 44, the first connecting segment 42, the middle segment 41, the second connecting segment 43, and the second contacting segment 45 of the rectangular probe 4 are formed to have the same outer diameter, but the present disclosure is not limited thereto. For example, in other embodiments of the present disclosure, the first contacting segment 44 or the second contacting segment 45 can be a pointed structure or other structures.

Figure 4:
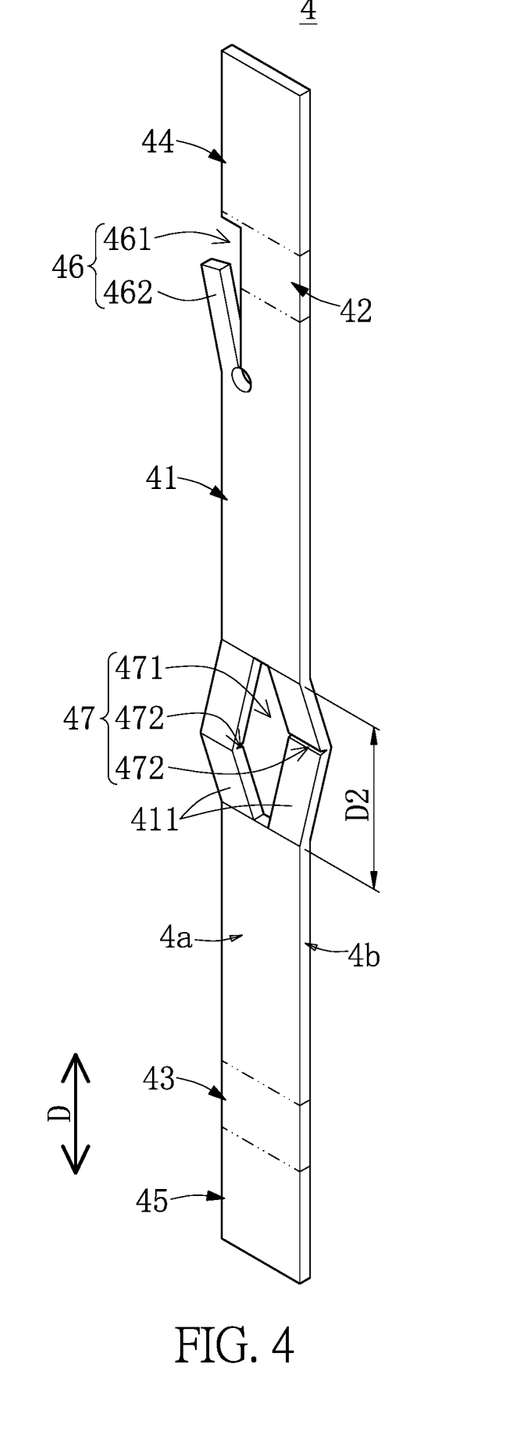
FIG. 4 is a perspective view of the rectangular probe that is applied with a force according to the first embodiment of the present disclosure.
Figure 5:
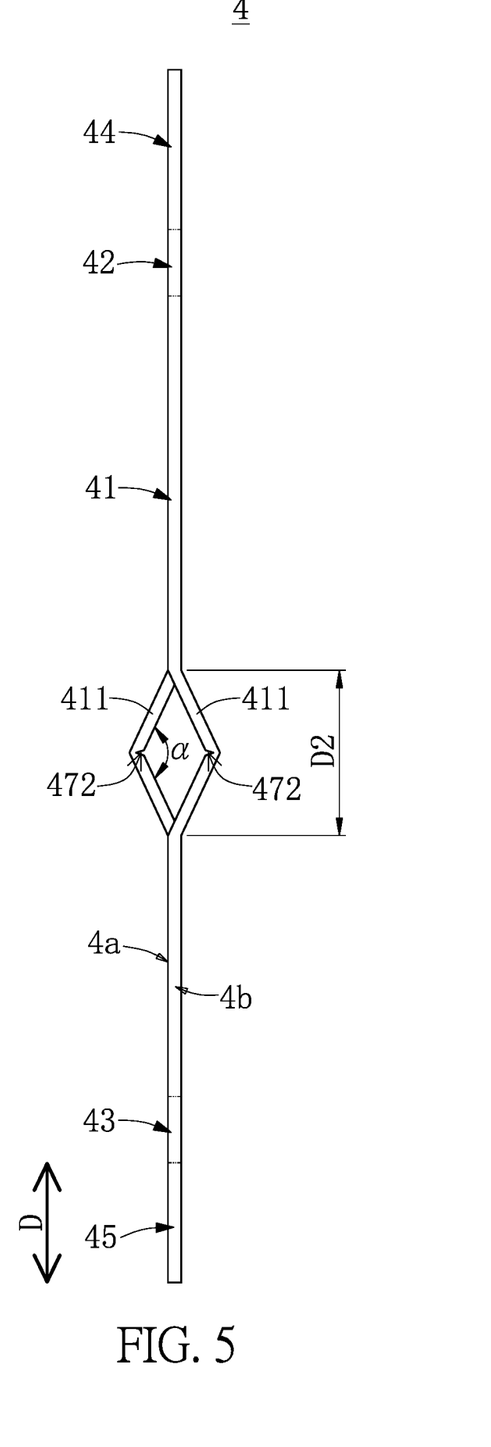
FIG. 5 is a side view of FIG. 4.

Specifically, as shown in FIG. 2, FIG. 4, and FIG. 5, the rectangular probe 4 further includes a stroke structure 47 arranged on the middle segment 41. The stroke structure 47 includes a longitudinal thru-hole 471 and two transverse grooves 472 that are in spatial communication with the longitudinal thru-hole 471. The longitudinal thru-hole 471 is formed by penetrating through the two broad side surfaces 4a and is parallel to the longitudinal direction D. The two transverse grooves 472 are respectively recessed in the two broad side surfaces 4a and are respectively arranged at two opposite sides of the longitudinal thru-hole 471. The two transverse grooves 472 in the present embodiment are located on a plane perpendicular to the longitudinal direction D.

Moreover, the two transverse grooves 472 extend from the longitudinal thru-hole 471 to the two narrow side surfaces 4b, respectively, and each of the two transverse grooves 472 in the present embodiment is in spatial communication with a center portion of the longitudinal thru-hole 471. The center portion of the longitudinal thru-hole 471 can be arranged at a position between 30%-70% of a length of the middle segment 41 along the longitudinal direction D. Specifically, a length L471 of the longitudinal thru-hole 471 is at least two times of a width W471 of the longitudinal thru-hole 471, the width W471 of the longitudinal thru-hole 471 is less than or equal to 30% of a width W4a of any one of the broad side surfaces 4a, and a depth T472 of each of the two transverse grooves 472 is less than or equal to 50% of a thickness T4 of the rectangular probe 4.

In summary, when the rectangular probes 4 of the high speed probe card device 1000 abut against the DUT, the two transverse grooves 472 of the stroke structure 47 of each of the rectangular probes 4 respectively move in two directions that are away from each other (the left direction and the right direction shown in FIG. 4), a portion of each of the rectangular probes 4 formed with the stroke structure 47 has a length in the longitudinal direction D that decreases, and the portion of each of the rectangular probes 4 generates an elastic force. In other words, when the rectangular probes 4 of the high speed probe card device 1000 depart from the DUT, each of the rectangular probes 4 become the straight structure by releasing the elastic force from the stroke structure 47.

Moreover, each of the rectangular probes 4 of the high speed probe card device 1000 can generate an elastic force by the stroke structure 46, so that the rectangular probe 4 does not need to have a curved elastic portion before being abutted against the DUT. Accordingly, the length of the rectangular probe 4 of the present disclosure is evidently less than that of the conventional probe, so that the high speed probe card device 1000 (or the rectangular probe 4) of the present disclosure is suitable to be applied to a transmission test with high speed signals. In other words, an inductance value of the rectangular probe 4 can be reduced by shortening the length of the rectangular probe 4, and the length of the rectangular probe 4 in the present embodiment is preferably within a range of 2-6.5 mm, but the present disclosure is not limited thereto. For example, in other embodiments of the present disclosure, the length of the rectangular probe 4 can be within a range of 1-10 mm.

Specifically, the portion of the rectangular probe 4 formed with the stroke structure 47 includes two elastic arms 411, and the two transverse grooves 472 are respectively recessed in substantial center portions of the two elastic arms 411, so that each of the two elastic arms 411 can be moved between a straight position and a curved position. When the rectangular probe 4 is abutted against the DUT, each of the two elastic arms 411 is at the curved position. When the rectangular probe 4 does not abut against the DUT, each of the two elastic arms 411 is at the straight position.

Since the two elastic arms 411 in the present embodiment are in a mirror symmetrical arrangement with respect to the longitudinal thru-hole 471, the drawings and the following description only describe one of the two elastic arms 411, but the present disclosure is not limited thereto. For example, in other embodiments of the present disclosure, the two elastic arms 411 can be formed of different structures.

When the elastic arm 411 is at the straight position, the elastic arm 411 has a first length D1 in the longitudinal direction D. When the elastic arm 411 is at the curved position, an inner edge of the elastic arm 411 has an angle α that is larger than 0 degrees and less than 180 degrees, so that the elastic arm 411 has a second length D2 in the longitudinal direction D, and D2=D1sin(α/2). The angle α is preferably an acute angle. Accordingly, when the rectangular probe 4 is abutted against the DUT, the portion of the rectangular probe 4 formed with the stroke structure 47 has a length in the longitudinal direction D that decreases by D1(1−sin(α/2)).

Figure 6:
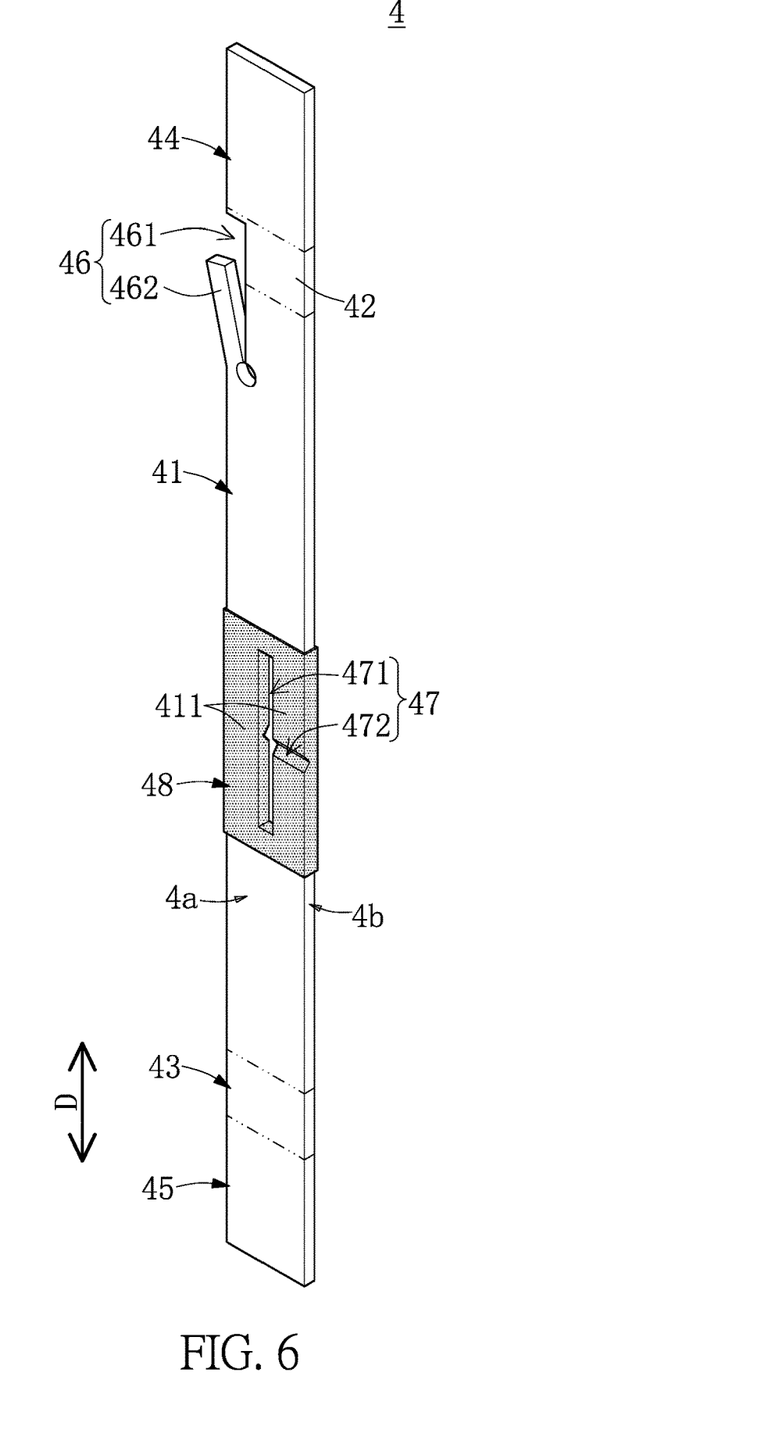
FIG. 6 is a perspective view of the rectangular probe that is formed with an insulating layer.

It should be noted that in order to prevent the stroke structures 47 of the rectangular probes 4 from touching each other, each of the rectangular probes 4 preferably includes an insulating layer 48 covering the portion (e.g., outer surfaces of the two elastic arms 411) thereof formed with the stroke structure 47.

Second Embodiment

Figure 7:
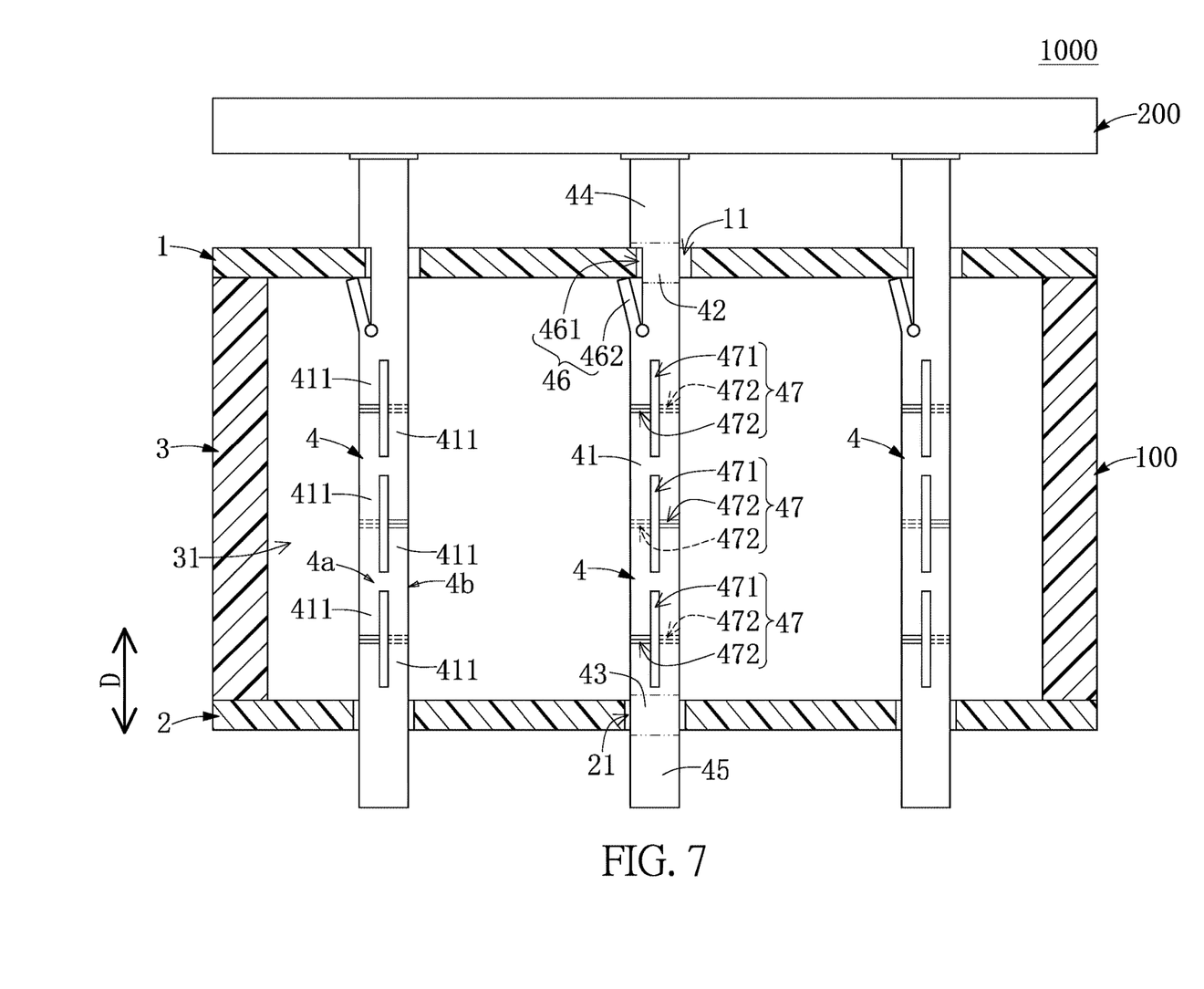
FIG. 7 is a cross-sectional view of a high speed probe card device according to a second embodiment of the present disclosure.
Figure 8:
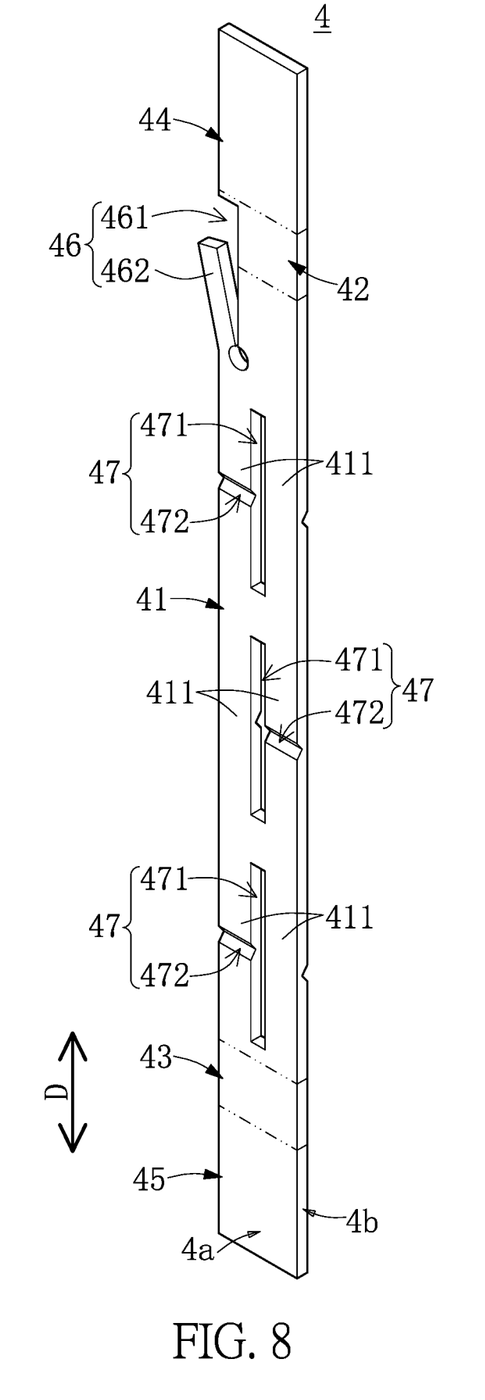
FIG. 8 is a perspective view of a rectangular probe according to the second embodiment of the present disclosure.
Figure 9:
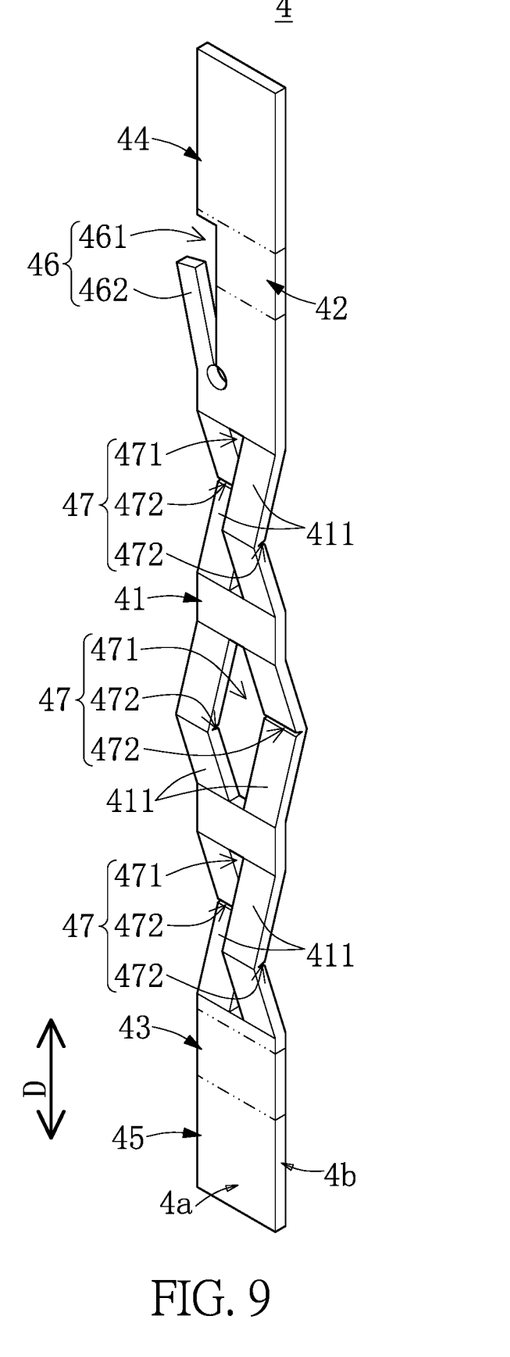
FIG. 9 is a perspective view of the rectangular probe that is applied with a force according to the second embodiment of the present disclosure.

Referring to FIG. 7 to FIG. 9, a second embodiment of the present disclosure provides a high speed probe card device 1000. Some components of the high speed probe card device 1000 in the present embodiment are similar to the corresponding components of the high speed probe card device 1000 disclosed in the first embodiment, so that the following description discloses only the different features of the present embodiment for the sake of brevity.

In the present embodiment, the number of the stroke structure 47 of each of the rectangular probes 4 is more than one, and the stroke structures 47 of each of the rectangular probes 4 are arranged on the middle segment 41 along the longitudinal direction D and are spaced apart from each other. According to the present embodiment and the first embodiment, the number of the stroke structure 47 of each of the rectangular probes 4 can be at least one.

Moreover, in each of the rectangular probes 4, the longitudinal thru-holes 471 of the stroke structures 47 are preferably arranged in a straight direction parallel to the longitudinal direction D, but the present disclosure is not limited thereto. In two of the stroke structures 47 of each of the rectangular probes 4 arranged adjacent to each other, two of the transverse grooves 472 recessed in the same broad side surface 4a and respectively belonging to the two stroke structures 47 are respectively in spatial communication with the two narrow side surfaces 4b. In other words, in the two adjacent stroke structures 47 of each of the rectangular probes 4, two of the transverse grooves 472 recessed in the same broad side surface 4a and respectively belonging to the two stroke structures 47 are not suited to be in spatial communication with the same narrow side surface 4b.

Accordingly, the rectangular probe 4 of the present embodiment can effectively reduce the moving distance of the transverse grooves 472 by adding the number of the stroke structures 47, so that the distance between the rectangular probes 4 can be reduced for increasing the distribution density of the rectangular probes 4 of the high speed probe card device 1000.

Third Embodiment

Figure 10:
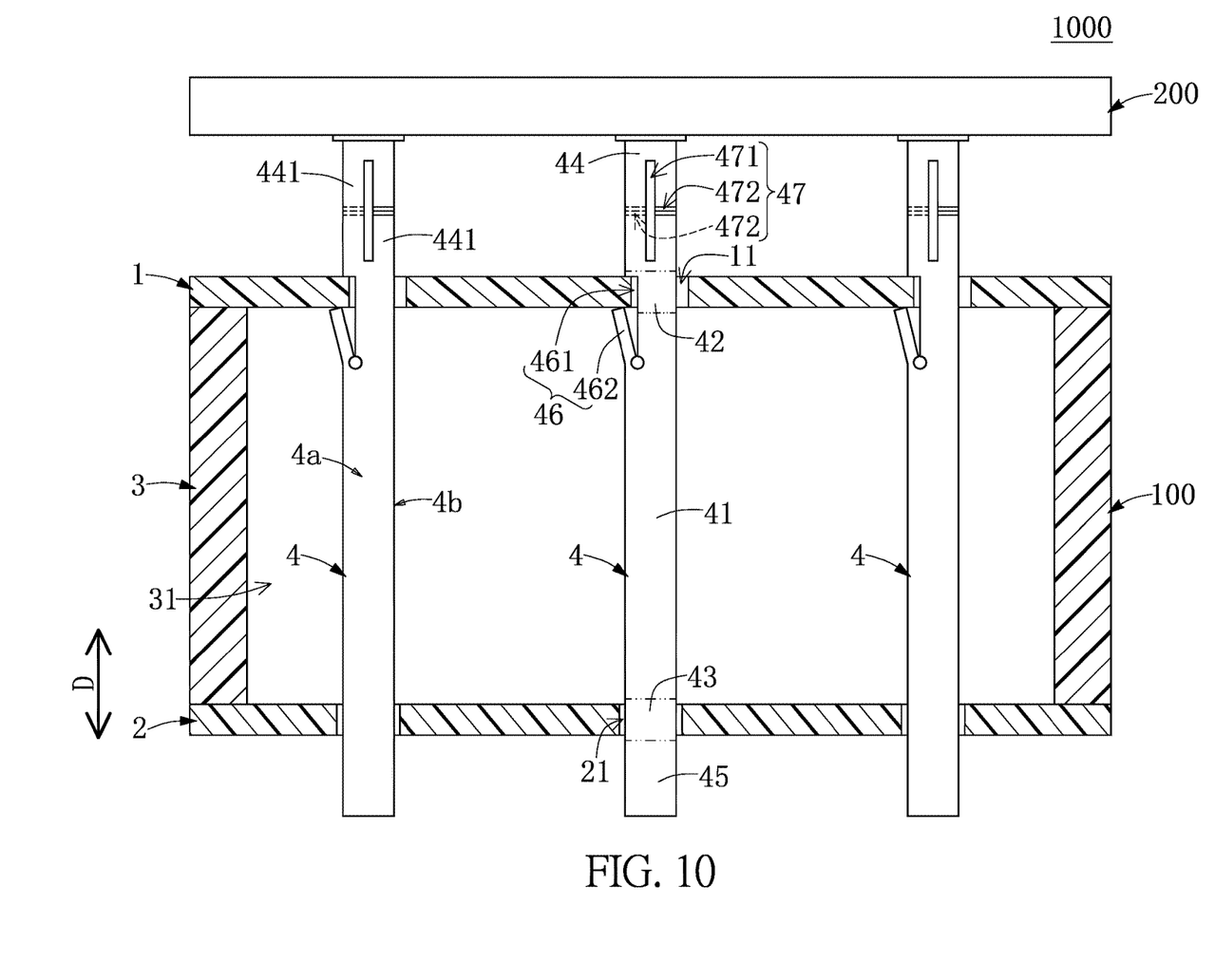
FIG. 10 is a cross-sectional view of a high speed probe card device according to a third embodiment of the present disclosure.
Figure 11:
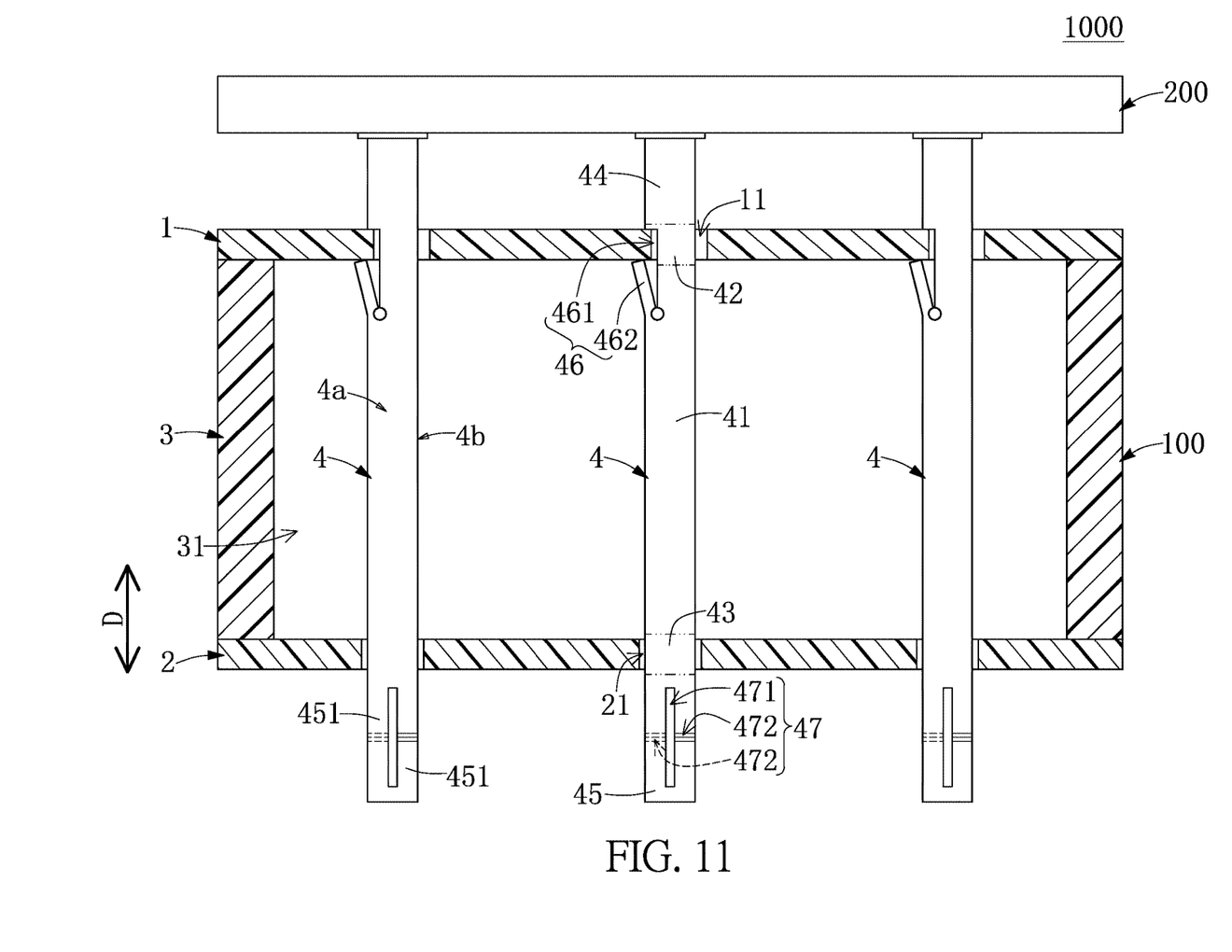
FIG. 11 is a cross-sectional view of the high speed probe card device in another structure according to the third embodiment of the present disclosure.

Referring to FIG. 10 and FIG. 11, a third embodiment of the present disclosure provides a high speed probe card device 1000. Some components of the high speed probe card device 1000 in the present embodiment are similar to the corresponding components of the high speed probe card device 1000 disclosed in the first embodiment, so that the following description discloses only the different features of the present embodiment for the sake of brevity.

In the present embodiment, the stroke structure 47 of the rectangular probe 4 can be arranged on the first contacting segment 44 or the second contacting segment 45, and the longitudinal thru-hole 471 of the stroke structure 47 does not extend to a free end of the first contacting segment 44 or a free end of the second contacting segment 45. Specifically, as shown in FIG. 10, the stroke structure 47 is arranged on the first contacting segment 44, so that the first contacting segment 44 includes two elastic arms 441. As shown in FIG. 11, the stroke structure 47 is arranged on the second contacting segment 45, so that the second contacting segment 45 includes two elastic arms 451.

According to the present embodiment, the first embodiment, and the second embodiment, the stroke structure 47 of each of the rectangular probes 4 in the present disclosure can be arranged on at least one of the middle segment 41, the first contacting segment 44, and the second contacting segment 45. In other embodiments of the present disclosure, each of the middle segment 41, the first contacting segment 44, and the second contacting segment 45 can be formed with one stroke structure 47.

In conclusion, in the high speed probe card device of the present disclosure, the rectangular probe can generate an elastic force by the stroke structure, so that the rectangular probe does not need to have a curved elastic portion before being abutted against the DUT. Accordingly, the length of the rectangular probe of the present disclosure is evidently less than that of the conventional probe, so that the high speed probe card device (or the rectangular probe) of the present disclosure is suitable to be applied to a transmission test with high speed signals. Specifically, the upper die and the lower die in the present disclosure can be not staggeredly arranged to each other, and each of the rectangular probes can be in a straight shape retained by at least one of the upper die and the lower die, so that the length of each of the rectangular probes can be within a range of 2-6.5 mm.

Moreover, the rectangular probe of the present disclosure can effectively reduce the moving distance of the transverse grooves by adding the number of the stroke structures, so that the distance between the rectangular probes can be reduced for increasing the distribution density of the rectangular probes of the high speed probe card device.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A high speed probe card device, comprising:
an upper die having a plurality of upper openings;
a lower die having a plurality of lower openings and parallel to the upper die, wherein the lower openings respectively correspond in position to the upper openings; and
a plurality of rectangular probes respectively passing through the upper openings of the upper die and respectively passing through the lower openings of the lower die, wherein each of the rectangular probes is in an elongated shape defining a longitudinal direction, an outer surface of each of the rectangular probes includes two broad side surfaces parallel to the longitudinal direction and two narrow side surfaces parallel to the longitudinal direction, and each of the rectangular probes includes:
a middle segment arranged between the upper die and the lower die;
a first connecting segment extending from one end of the middle segment and arranged in the corresponding upper opening;
a second connecting segment extending from the other end of the middle segment and arranged in the corresponding lower opening;
a first contacting segment extending from the first connecting segment and arranged outside of the corresponding upper opening;
a second contacting segment extending from the second connecting segment and arranged outside of the corresponding lower opening; and
at least one stroke structure arranged on at least one of the middle segment, the first contacting segment, and the second contacting segment, wherein the at least one stroke structure includes:
a longitudinal thru-hole formed by penetrating through the two broad side surfaces and parallel to the longitudinal direction; and
two transverse grooves respectively recessed in the two broad side surfaces and respectively arranged at two opposite sides of the longitudinal thru-hole, wherein the two transverse grooves extend from the longitudinal thru-hole to the two narrow side surfaces, respectively, and the two transverse grooves are located on a plane perpendicular to the longitudinal direction;
wherein when the rectangular probes of the high speed probe card device abut against a device under test (DUT), the two transverse grooves of the at least one stroke structure of each of the rectangular probes respectively move in two directions away from each other, a portion of each of the rectangular probes formed with the at least one stroke structure has a length in the longitudinal direction that decreases, and the portion of each of the rectangular probes generates an elastic force.

2. The high speed probe card device according to claim 1, wherein in the at least one stroke structure of each of the rectangular probes, a depth of each of the two transverse grooves is less than or equal to 50% of a thickness of the corresponding rectangular probe, and each of the two transverse grooves is in spatial communication with a center portion of the longitudinal thru-hole.

3. The high speed probe card device according to claim 1, wherein in the at least one stroke structure of each of the rectangular probes, a length of the longitudinal thru-hole is at least two times of a width of the longitudinal thru-hole, and the width of the longitudinal thru-hole is less than or equal to 30% of a width of any one of the broad side surfaces.

4. The high speed probe card device according to claim 1, wherein in each of the rectangular probes, the number of the at least one stroke structure is more than one, and the stroke structures are arranged on the middle segment along the longitudinal direction and are spaced apart from each other.

5. The high speed probe card device according to claim 4, wherein in two of the stroke structures of each of the rectangular probes arranged adjacent to each other, two of the transverse grooves recessed in the same broad side surface and respectively belonging to the two stroke structures are respectively in spatial communication with the two narrow side surfaces.

6. The high speed probe card device according to claim 1, wherein each of the rectangular probes includes an insulating layer covering the portion thereof formed with the at least one stroke structure.

7. The high speed probe card device according to claim 1, wherein the upper die and the lower die are not staggeredly arranged to each other, each of the rectangular probes is in a straight shape and is retained by at least one of the upper die and the lower die, the lower openings respectively align with the upper openings along the longitudinal direction, and each of the rectangular probes has a length that is within a range of 2-6.5 mm.

8. The high speed probe card device according to claim 7, wherein each of the rectangular probes includes a retaining structure arranged on at least one of the first connecting segment and a part of the middle segment that is arranged adjacent to the first connecting segment, and each of the rectangular probes is positioned at the upper die through the retaining structure thereof.

9. The high speed probe card device according to claim 1, further comprising:
   a spacer sandwiched between the upper die and the lower die, wherein the spacer has an accommodating space in spatial communication with the upper openings and the lower openings; and
   a space transformer fixed on the first contacting segments of the rectangular probes, wherein each of the rectangular probes is positioned at the upper die that is arranged adjacent to the space transformer;
   wherein the second contacting segments of the rectangular probes are configured to abut against the DUT.

10. A rectangular probe having an elongated shape defining a longitudinal direction and having an outer surface that includes two broad side surfaces parallel to the longitudinal direction and two narrow side surfaces parallel to the longitudinal direction, comprising:
   a middle segment;
   a first connecting segment and a second connecting segment respectively extending from two opposite ends of the middle segment;
   a first contacting segment extending from the first connecting segment in a direction away from the middle segment;
   a second contacting segment extending from the second connecting segment in a direction away from the middle segment; and
   at least one stroke structure arranged on at least one of the middle segment, the first contacting segment, and the second contacting segment, wherein the at least one stroke structure includes:
      a longitudinal thru-hole formed by penetrating through the two broad side surfaces and parallel to the longitudinal direction; and
      two transverse grooves respectively recessed in the two broad side surfaces and respectively arranged at two opposite sides of the longitudinal thru-hole, wherein the two transverse grooves extend from the longitudinal thru-hole to the two narrow side surfaces, respectively, and the two transverse grooves are located on a plane perpendicular to the longitudinal direction;
   wherein when the rectangular probe abuts against a device under test (DUT), the two transverse grooves of the at least one stroke structure respectively move in two directions away from each other, a portion of the rectangular probes formed with the at least one stroke structure has a length in the longitudinal direction that decreases, and the portion of the rectangular probes generates an elastic force.

* * * * *